United States Patent [19]

Cheng et al.

[11] Patent Number: 5,645,970

[45] Date of Patent: Jul. 8, 1997

[54] WEAK BASE DEVELOPABLE POSITIVE PHOTORESIST COMPOSITION CONTAINING QUINONEDIAZIDE COMPOUND

[75] Inventors: Hua-Chi Cheng, Hsinchu; Chao H. Tseng, Taipei; Pao-Ju Hsieh, Keelung, all of Taiwan

[73] Assignee: Industrial Technology Research Institute, Hsinchu, Taiwan

[21] Appl. No.: 547,753

[22] Filed: Oct. 25, 1995

[51] Int. Cl.$^6$ .................................... G03F 7/023
[52] U.S. Cl. .............. 430/192; 430/7; 430/165; 430/193
[58] Field of Search ................ 430/192, 193, 430/165, 7

[56] References Cited

U.S. PATENT DOCUMENTS

| | | | |
|---|---|---|---|
| 3,046,118 | 7/1962 | Schmidt et al. | 96/33 |
| 3,148,983 | 9/1964 | Endermann et al. | 96/33 |
| 3,402,044 | 9/1968 | Steinhaff et al. | 96/91 |
| 4,115,128 | 9/1978 | Kita | 1/60 |
| 4,173,470 | 11/1979 | Fahrenholtz | 430/5 |
| 4,551,409 | 11/1985 | Gulla et al. | 1/60 |
| 4,719,167 | 1/1988 | Miura et al. | 1/60 |
| 4,971,887 | 11/1990 | Schmitt et al. | 430/192 |
| 5,087,548 | 2/1992 | Hosaka et al. | 430/192 |
| 5,214,541 | 5/1993 | Yamasita et al. | 5/22 |
| 5,214,542 | 5/1993 | Yamasita et al. | 5/22 |
| 5,322,757 | 6/1994 | Ebersole | 430/192 |
| 5,324,620 | 6/1994 | Ebersole | 430/192 |

Primary Examiner—John S. Chu
Attorney, Agent, or Firm—W. Wayne Liauh

[57] ABSTRACT

A positive photoresist composition is disclosed which comprises a photosensitive compound, a phenolic resin, and an organic solvent. The phenolic resin is prepared from a monomeric composition comprises formaldehyde and a mixture of phenol monomers. The mixture of phenol monomers comprises: (a) no more than 98 mole percent of a mixture of monohydroxy phenols, the mixture of monohydroxy phenols comprises: (I) about 50~80 mole percent of meta-methylphenol; (ii) about 10~30 mole percent of 2,5-dimethylphenol; and (iii) about 10~40 mole percent of 2,3,5-trimethylphenol; and (b) at least 2 mol percent of at least one polyhydroxybenzene which is presented by the following formula:

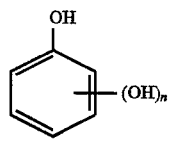

wherein n is an integer of 1 or 2. Preferably, the polyhydroxybenzene is a mixture of trihydroxybenzene and dihydroxybenzene in a molar ratio of about 40 to 60. The photoresist composition can be developed using a weak basic solution which causes images of sharp contrast to be developed; it can also be advantageously used in making color filters for use in color liquid crystal displays in a multiple development process in conjunction with an electrodeposition lithography.

15 Claims, No Drawings

WEAK BASE DEVELOPABLE POSITIVE PHOTORESIST COMPOSITION CONTAINING QUINONEDIAZIDE COMPOUND

FIELD OF THE INVENTION

The present invention relates to a positive photoresist composition for use in microlithography and in making color filters for color liquid displays. More specifically, the present invention relates to a novel positive photoresist composition containing a photosensitive compound dispersed in a resinous matrix suitable for the manufacture of IC circuits, photomasks, lithographic printing plates, and color filters using electrodeposition lithography. The photoresist disclosed in the present invention provides improved resolution via improved contrast, improved heat and oxidation resistances, and can be developed with a weak basic developer solution.

BACKGROUND OF THE INVENTION

Microlithography has been widely used in the electronics industry for more than twenty years. With the rapid growth of the electronics/information industry and the continuous improvements in the technologies for manufacturing VLSI circuitry and color filters for liquid crystal displays, today microlithography plays an even more important role, and it is important to devote research and development effort for improved microlithographical technology.

One of the key elements of microlithography is the photoresist composition. A photoresist composition comprises a coating composition produced from a solution or applied as a dry film which, when exposed to light, will be chemically altered in its solubility to certain solvents, or the so-called "developers". The are two main types of photoresists, negative photoresists and positive photoresists. The negative photoresist is a mixture which is initially soluble in a developer, but upon exposure to light, becomes insoluble in that developer to thereby form a latent image. A positive photoresist, on contrast, is a mixture which is initially insoluble in the developer. Upon exposure to light, the photoresist becomes soluble in the developer to form a positive image. Positive photoresists are typically more expensive than negative photoresists. However, because positive photoresists can produce images with substantially better resolution and possess superior heat and oxidative resistances, they are more suitable for use in the manufacturing of high density microelectronic components using microlithography, and have thus become the mainstream material in related fields.

A photoresist composition typically comprises a photosensitive compound dispersed in an appropriate polymer binder. The most commonly used polymer binder is a phenolic resin, which is a condensation copolymer of phenol (s) and formaldehyde. The phenolic resin is soluble in many organic solvents as well as in basic solutions. With regard to photosensitive compounds, many quinonediazide compounds have been used for this purpose to form positive images. These quinonediazide compounds will be chemically converted into carboxylic acids upon exposure to light rays of appropriate wavelengths. The resultant carboxylic acids are substantially more soluble in basic solutions than the original unconverted compounds. Thus when the wafer or any substrate that has been coated with a film containing such a positive photosensitive compound is treated with a basic solution (i.e., a developer), the exposed regions will have a higher rate of dissolution than the unexposed regions. Such a difference in the rate of dissolution in a basic solution causes the desired images to be developed.

The quinonediazide compounds are the most widely used positive-imaging-forming photosensitive compounds. Examples of these quinonediazide compounds include esters 1,2-naphthoquinone diazide-5-sulfonyl chloride or 1,2-naphthoquinone diazide-4-sulfonyl chloride with trihydroxybenzophenone. These and other quinonediazide compounds suitable for use in making positive photoresists are disclosed in U.S. Pat. Nos. 3,046,118; 3,148,983; 3,402,044; 4,115,128; 4,173,470; 4,550,069; 4,551,409; Laid-Open Japan Patent Application Nos. 60-134,235; 60-138,544; 60-143,355; 60-154,248; and European Patent Application No. 0092444. The contents of these patent and patent applications are hereby incorporated by reference.

Positive photoresists have also been used in electrodeposition lithography, which involves combining the techniques of microlithography and electrodeposition of color filter resins to produce color filters for use in color liquid crystal displays. Discussions of these processes have been described in U.S. Pat. Nos. 5,214,541 and 5,214,542, the contents thereof are incorporated herein by reference. In these applications, a positive photosensitive coating film is formed on a transparent electrically conductive substrate. The photosensitive coating film is exposed to light through a mask having patterns of at least three different degrees of light transmittances with respect to light rays of different wavelengths, typically of the red, green and blue light colors. Then a portion of the photosensitive coating film is developed and removed to register with one of the patterns of smallest and largest degrees of light transmittances for exposing the transparent eclectically conductive layer. Thereafter, a colored coating is electrodeposited on the exposed electrically conductive layer for forming a colored layer thereon. The steps of developing and removing the photosensitive coating film and electrodepositing the colored coating are repeated for the respective patterns of different degrees of light transmittance in sequence of difference in light transmittances to form different colored layers. These steps for forming the color filters using a positive photoresist is summarized below:

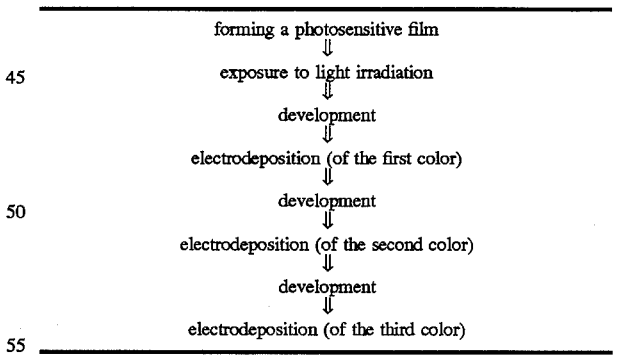

One of the main advantages of the multi-color lithographic/electrodeposition process described above is that only one photomask is required and the photosensitive compound only has be exposed to the light source once. However, the photoresist that can be used for this process must exhibit an ability such that it can be successively developed by a developer solution of increased strengths or concentrations, so as to allow multi-colors to be electrodeposited on the transparent substrate.

Because the dimensions of the commercial electronic equipment are getting smaller everyday, increased precision is required of the micro-electronic components. This imposes a severe demand on the IC manufacturers to ensure the exactness of the microlithographic technology. In order to satisfy this need, the photoresist must provide high resolution and can be developed in a relatively quick manner. Most of the photoresists do not provide the kind of resolution and speed that will satisfy today's stringent requirement. Furthermore, the photoresists that are currently available require relatively strong basic solution, at least at the level of 2.38% tetramethyl ammonium hydroxide, for image development. The high alkalinity required of the developer solution can be deleterious to the lithographic process and high consumptions of exposure energy and developer solution.

U.S. Pat. No. 4,731,319, the content thereof is incorporated by reference, discloses a phenolic polymer binder for use in photoresist prepared from copolymerization of isomers of meta- and para-methylphenols and formaldehyde to obtain improved heat-resistance. Japanese Laid-Open patent publication 60-164,740 further included 3,5-dimethylphenol to the copolymer composition to increase the softening temperature thereof. Other references, the contents thereof are incorporated by reference, also discuss using other improved phenol-formaldehyde copolymers for various purposes. These include: U.S. Pat. No. 4,719,167, which discloses the use of a mixture of meta- and para-methylphenols and 2,5-dimethylphenol in preparing the phenol-formaldehyde copolymer; European Patent Application No. 0496640 (1992) discloses the use of a mixture of meta-methylphenol, 2,3-dimethylphenol, and 3,4-dimethylphenol in the preparation of the phenol-formaldehyde copolymer; WO91/03769 discloses the use of a mixture of 2,3-dimethylphenol and 2,3,5-trimethylphenol in preparing the phenolic resin.

These polymer binders increased the stiffness of the polymeric structure so as to obtain improved heat resistance and improved contrast. However, they do not address the problems discussed above. For example, these polymer binders can only be used in single-exposure single-development micro-lithographic applications, and are not suitable for making color filters via multiple image development. Also, because the main objectives of these polymer binders are to improve the heat resistance and etching resistance of the polymer binder, these polymers possess a relatively stiff molecular structure. As a consequence, a highly basic solution, typically a 2.38% tetraammonium hydroxide, is required for image development. The need for a strong basic developer solution imposes several problems especially when they are to be used as a photoresist component in making color filters (for color liquid crystal displays) using electrodeposition techniques. Typically a cationic resin is used in the electrodeposition process to provide the color films. Before they are hardened, these electrodeposited anionic resins contain acid groups, and the strong basic developer solution often causes the color films to be peeled off from the substrate. Thus the use of a strong basic developer solution severely limits the type of electrodepositing solution that can be used in the electrodeposition process.

In 1991, D. N. Khanna presented a paper which disclosed the use of a mixture of meta-methylphenol, 3,5-dimethylphenol, and resorcinol in the preparation of a phenolic resin (SPE "Polymer Session," p91–111, 1991). The photoresist made from the phenolic resin exhibited both improved heat resistance and improved image developing speed. However, this phenolic polymer binder is suitable only in providing submicron resolutions, and, because it is only suitable in the traditional lithography, it is not suitable for making color filters for color liquid crystal displays, which involve line width in excess of 20 μm.

SUMMARY OF THE INVENTION

The primary object of the present invention is to develop an improved positive photoresist composition for use in microlithography and in making color filters for color liquid displays. More specifically, the primary object of the present invention is to develop an improved positive photoresist composition containing a quinonoediazide-based photosensitive compound dispersed in an improved resinous matrix which provides improved resolution, improved heat-resistance, and can be developed with a weak basic solution. The improved positive photoresists disclosed in the present invention can be advantageously used in the manufacture of IC circuits via VLSI processes, photomasks, lithographic printing plates, etc. The improved positive photoresists disclosed in the present invention can also be advantageously used in making color filters for use in color liquid crystal displays in conjunction with electrodeposition lithography.

One of the main advantages of the positive photoresists disclosed in the present invention is that they can be developed by a weak basic developer solution (less than 1.5% sodium meta-silicate). This was achieved in the present invention by increasing the content of the polyhydroxy aromatics, such as trihydroxybezene and dihydroxybenzene, in the polymer binder, so as to reduce the stiffness of the copolymer structure and reduce its resistance to alkaline solution and increase the speed of image development. The photoresist disclosed in the present invention does not require high exposure energy to convert the photosensitive groups in the quinonoediazide to carboxylic acid. The hydrophilicity of the carboxylic acid-containing quinonoediazide compound and the weak base-soluble phenolic resin of the present invention make the exposed areas to be easily diluted out and/or washed off by the developer solution without leaving any residues. In the unexposed regions, the hydrophobic quinonoediazide compound and the weak base-soluble phenolic resin form an azo coupling reaction, thereby causing the solubility of the photosensitive compound in a basic solution to be substantially reduced. This minimizes the amount of film thickness loss when the substrate is being developed and increases the contrast ratio. The photoresist composition disclosed in the present invention also allows partial conversion of the photosensitive groups upon incomplete light exposure. Such a partial conversion allows different degrees of solubility to be achieved at different region of the photoresist film.

The photoresist disclosed in the present invention provides excellent resolution, and thus can be advantageously used in high precision microlithography for fabricating high density integrated circuits. The photoresist disclosed in the present invention also allows multiple image development at at least two levels of exposure energy. A relatively wide window of exposure energy (at least 150 mJ/cm$^2$) can be employed with the photoresist of the present invention, while maintaining excellent contrast ratio and without causing loss in film thickness. The photoresist disclosed in the present invention also allows anionic electrodepositing resins to be used in the electrodeposition process. This is another distinctive advantage of the present invention over the prior art positive photoresists, which are limited to using cationic electrodepositing resins.

The photoresist composition disclosed in the present invention can be developed in a variety of basic solutions, including aqueous solutions of sodium carbonate, sodium bicarbonate, sodium metasilicate, tetraammonium hydroxide, or a mixture thereof. The preferred range of the developer concentration is about 0.4 to 1.5 wt %, at a temperature of 10°~70° C., preferably 15°~40° C. About 30~600 seconds are required for image development. The photoresist composition can be developed with exposure energy in the range between 200 and 700 mJ/cm², with a film thickness of 1~2.5 μm. The "cumulative" nature of the exposure energy at different regions of the photoresist film allows successive image development to be obtaioned based on different degrees of exposure (using a photomask of varying regions of light transmittances). The high contrast ratio provided by the photoresist composition of the present invention is also an important factor making this multiple development possible.

The photoresist disclosed in the present invention comprises a photosensitive compound, about 5 to 20 wt %, a phenolic resin, which is a copolymer of phenols and formaldehyde, about 20 to 50 wt %, and an organic solvent, about 30 to 75 wt %. The phenolic resin is a condensation copolymer prepared from a monomeric composition containing formaldehyde, a mixture of monohydroxy phenols, and at least 2.0 mol % of polyhydroxybenzenes in the polymer backbone. The mixture of monohydroxy phenols contains the following monohydroxy phenols:

(1) about 50~80 mol %, preferably 60~70 mol %, of meta-methylphenol;

(2) about 10~30 mol %, preferably 15~25 mol %, of 2,5-dimethylphenol;

(3) about 10~40 mol %, preferably 20~30 mol %, of 2,3,5-trimethylphenol.

The polyhydroxybenzenes used in the present invention are present by the following formula:

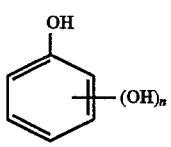

where n is an integer of 1 or 2. Preferred embodiments of the polyhydroxybenzenes for preparing the polymer binder of the photoresists disclosed in the present invention include trihydroxybezene, dihydroxybenzene, or a mixture thereof.

In the photoresist composition disclosed in the present invention, the photosensitive compound can be a quinonoediazide-based compound represented by the following formula:

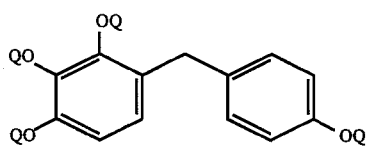

wherein Q is preferably 1,2-naphthoquinone diazide-4-sulfonyl radical or 1,2-naphthoquinone diazide-5-sulfonyl radical represented by the following formulas, respectively:

(1,2-naphthoquinone diazide-4-sulfonyl group);

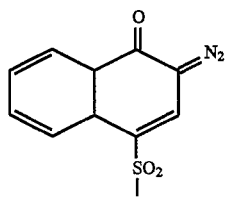

(1,2-naphthoquinone diazide-5-sulfonyl group):

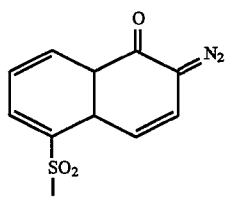

DETAILED DESCRIPTION OF THE PREFERRED EMBODIMENT

The present invention discloses a weak-base-developable, positive-image-forming positive photoresist composition containing a quinonoediazide-based photosensitive compound dispersed in a phenolic polymer binder. The positive photoresist composition disclosed in the present invention can be advantageously used in microlithographic processes for making high density integrated circuits and, in conjunction with electrodeposition technique, for making color filters for color liquid displays. The positive photoresist composition disclosed in the present invention exhibited improved resolution, improved heat-resistance, and can be developed with a weak basic solution (less than 1.5% sodium metasilicate).

The photoresist composition disclosed in the present invention comprises about 5 to 20 wt % of a photosensitive compound, preferably a quinonoediazide-based photosensitive compound, about 20 to 50 wt % of a phenolic formaldehyde resin, and a solvent, about 30 to 75 wt %. The phenolic resin is a condensation copolymer prepared from a monomeric composition containing formaldehyde, a mixture of monohydroxy phenols, and at least 2.0 mol % of polyhydroxybenzenes. The mixture of monohydroxy phenols contains the following monohydroxy phenols:

(1) about 50~80 mol %, preferably 60~70 mol %, of meta-methylphenol;

(2) about 10~30 mol %, preferably 15~25 mol %, of 2,5-dimethylphenol;

(3) about 10~40 mol %, preferably 20~30 mol %, of 2,3,5-trimethylphenol.

The polyhydroxybenzenes used in the present invention are present by the following formula:

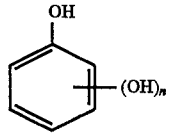

where n is an integer of 1 or 2. Preferred embodiments of the polyhydroxybenzenes for preparing the polymer binder of the photoresists disclosed in the present invention include trihydroxybezene, dihydroxybenzene (preferably meta-dihydroxybenzene), or a mixture thereof. Preferably, the polyhydroxybenzene is a mixture of trihydroxybezene and dihydroxybenzene in a molar ratio of about 40 to 60.

In the photoresist composition disclosed in the present invention, the photosensitive compound can be a quinonoediazide-based compound represented by the following formula:

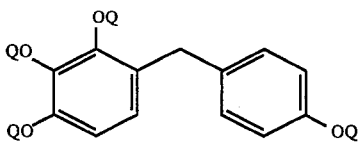

wherein Q is a preferably 1,2-naphthoquinone diazide-x-sulfonyl radical (x can be either 4 or 5) represented by the following formulas:

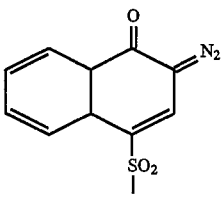

(1,2-naphthoquinone diazide-4-sulfonyl group)

or

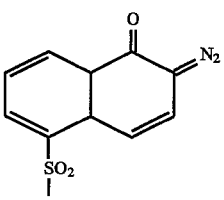

(1,2-naphthoquinone diazide-5-sulfonyl group)

A wide variety of organic solvents can be used in preparing the photoresist composition of the present invention. Examples of these organic solvents include: ethylene glycol monomethyl ether acetate, ethyl lactate, N-methylpyrrolidone, cyclopentanone, or a mixture thereof. However, many other organic solvents can also be used.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

Example 1: Preparation of Phenolic Resin

A monomeric composition containing 324 g (3 mole) of meta-methylphenol (monomer A), 91.5 g (0.75 mole) of 2,5-dimethylphenol (monomer B), 170 g (1.25 mole) of 2,3,5-trimethylphenol (monomer C), 6.3 g (0.05 mole) of trihydroxybezene (monomer D), and 5 g (0.05 mole) of dihydroxybenzene (monomer E) was prepared. The monomer composition was placed into a 2-liter reaction vessel, into which 29.84 g of a catalyst oxalic acid and 320 g of an organic solvent diethyldimethyl ether were added. After purging with nitrogen to remove air, the reaction vessel was heated in an oil bath to 105° C. After the temperature of the reaction mixture reached about 96°~98° C., it was placed into a reflux and the reaction continued for 5 hours. Then a distillation device was affixed to the reaction vessel and the temperature of oil bath was set at 120, 140, 160, 180, and 210° C., and heated for one hour at each temperature. After the temperature of the reaction mixture reached 200° C., the pressure in the distillating reaction vessel was gradually reduced to remove solvent and water. When the pressure of the reaction vessel reached below 5 torr, the distillation was stopped and nitrogen gas was introduced into the vessel to cool the temperature of the reaction mixture to room temperature.

Examples: 2–4 Preparations of Phenolic Resins

The procedures in Examples for preparing phenolic resins were identical to that described in Example 1, except the reaction monomeric compositions were different. In Example 2, the amount of dihydroxybenzene (monomer E) was 0.075 moles. In Example 3, the amount of trihydroxybezene (monomer D) was 0.075 moles. In Example 4, the amounts of dihydroxybenzene (monomer E) and trihydroxybezene (monomer D) were both 0.075 moles. The phenolic monomer compositions of Examples 1 through 4 are summarized in Table 1, below.

TABLE 1

|  | meta-methyl-phenol (mole) | 2,5-dimethyl-phenol (mole) | 2,3,5-trimethyl-phenol (mole) | trihydroxybezene (mole) | dihydroxybenzene (mole) |
| --- | --- | --- | --- | --- | --- |
| Example 1 | 3 | 0.75 | 1.25 | 0.05 | 0.05 |
| Example 2 | 3 | 0.75 | 1.25 | 0.05 | 0.075 |
| Example 3 | 3 | 0.75 | 1.25 | 0.075 | 0.05 |
| Example 4 | 3 | 0.75 | 1.25 | 0.075 | 0.075 |

Example 5: Preparation of Photosensitive Compound 1.0 mole of 2,3,4,4'-tetrahydroxy-diphenyl-methane (2,3, 4,4'-THDM) and 2.0 moles of 1,2-naphthoquinone diazide-5-sulfonyl chloride (5-NDSC) were placed into a 5-liter reaction vessel, into which 3 liters of 1,4-dioxycyclohexane were added, followed by the addition of 620 g of 10 wt % sodium carbonate at room temperature within a time span of one hour. The reaction mixture was allowed to react for one hour, then the reaction product was slowly added into one liter of 1 wt % dilute hydrochloric acid solution, causing precipitate to be formed. The precipitate was filtered out and rinsed with deionized water until its pH became neutral. The yellowish precipitate was dried at room temperature.

34 g of the yellowish precipitate obtained above, 0.05 g of dimethylaminopyridine, 5 g of acetic anhydride, 1.5 liters of ketone, and 150 ml of water were mixed and stirred in a 2-liter flask. The reaction mixture was maintained at 45° C. for one hour during which 4.9 g of triethylamine was gradually added therein. After reacting for one hour, 2% of hydrochloric acid in deionized water was gradually added into the reaction mixture, and the precipitate so produced was filtered and rinsed with deionized water until its pH became neutral. Finally the yellowish product was dried at room temperature to produce the quinonoediazide-based photosensitive compound.

Example 6: Preparation of Photoresist Composition 50 g of the phenolic resin obtained from Example 1, 21.5 g of the quinonoediazide-based photosensitive compound and 120 g of cyclopentanone were mixed and stirred for more than eight hours to effectuate the dissolution of the solid ingredients. The solution mixture was filtered through a 0.2 μm Millipore filter to obtain a photoresist composition.

Examples 7 through 9: Preparations of Photoresist Compositions

The procedures in Examples 7 through 9 were identical to that in Example 6, except that the phenolic resins obtained from Examples 2 through 4, respectively, were used.

Example 10: Multiple-Development Lithographic Imaging

A film containing the photoresist composition prepared from Example 6 was formed, via a spin-coating procedure, onto an electrically conductive transparent glass substrate. The transparent conductive glass substrate had a thickness of 1.1 mm. The glass substrate containing the photoresist film was heated in a 90° C. oven for 1.5 min to obtain a dry film on the glass substrate which was measured to have a thickness of 2.2 μm. The photoresist film was exposed to a broad-band light (300~450 nm) under a photomask, which contains patters of different degrees of light transmittances. After exposure to the light, the photoresist film was immersed into a 0.4% $Na_2SiO_3$ solution for first image development. This first development removed the areas with the highest amount of exposure energy (i.e., areas with 100% exposure). The photoresist composition was rinsed with water and blow-dried, and a filmameter was used to determine the film thicknesses at various regions of the film having different degrees of light exposure. Thereafter, a 1% $Na_2SiO_3$ solution was used to remove the partially exposed region (leaving the unexposed region unaffected) for a second image development. The film thicknesses at various regions of the photoresist film different different degrees of light exposure are summarized in Table 2, below.

TABLE 2

| Exposure Energy (mJ/cm²) | Film Thickness After First Development | Film Thickness After Second Development | Loss in Film Thickness (Unexposed Area) |
| --- | --- | --- | --- |
| 500 | 0 μm | 0 μm | — |
| 250 | greater than 0.6 μm | 0 μm | — |
| 100 | greater than 1.2 μm | greater than 0.5 μm | — |
| 0 | 2.2 μm | 2.2 μm | 0 μm |

Examples 11 through 13: Multiple-Development Lithographic Imaging

The procedures in Examples 11 through 13 were identical to that described in Example 10, except that the photoresist compositions obtained from Examples 7 through 9, respectively, were used in forming the film on the transparent conductive glass substrate. The measured results are similar to those shown in Table 2.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A positive photoresist composition comprising a photosensitive compound and a phenolic resin, wherein said phenolic resin is prepared from a monomeric composition comprising formaldehyde and a mixture of phenol monomers, and said mixture of phenol monomers comprises:
   (a) no more than 98 mole percent of a mixture of monohydroxy phenols, said mixture of monohydroxy phenols comprises:
      (I) about 50~80 mole percent of meta-methylphenol;
      (ii) about 10~30 mole percent of 2,5-dimethylphenol; and
      (iii) about 10~40 mole percent of 2,3,5-trimethylphenol; and
   (b) at least 2 mole percent of at least one polyhydroxybenzene, said polyhydroxybenzene being presented by the following formula:

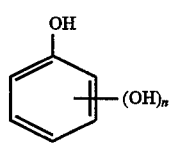

wherein n is an integer of 1 or 2.

2. A positive photoresist composition according to claim 1 wherein said polyhydroxybenzene is selected from the group consisting of trihydroxybenzene, dihydroxybenzene, and a mixture thereof.

3. A positive photoresist composition according to claim 1 wherein said polyhydroxybenzene is a mixture of a trihydroxybenzene and a dihydroxybenzene.

4. A positive photoresist composition according to claim 1 wherein said polyhydroxybenzene is a mixture of a trihydroxybenzene and a dihydroxybenzene in a molar ratio of about 40 to 60.

5. A positive photoresist composition according to claim 1 wherein said mixture of phenol monomers contains about 60~70 mole percent of meta-methylphenol.

6. A positive photoresist composition according to claim 1 wherein said mixture of phenol monomers contains about 15~25 mole of 2,5-dimethylphenol.

7. A positive photoresist composition according to claim 1 wherein said mixture of phenol monomers contains about 20~30 mole percent of 2,3,5-trimethylphenol.

8. A positive photoresist composition according to claim 1 wherein said phenolic resin is prepared from a condensation polymerization of said monomeric composition, which comprises formaldehyde, said mixture of phenol monomers, and a mixture of trihydroxybezene and dihydroxybenzene in the presence of an acidic catalyst.

9. A positive photoresist composition according to claim 1 which can be developed with a weak basic developer solution having an alkalinity equivalent to no greater than that of a 1.5 wt % sodium metasilicate.

10. A positive photoresist composition according to claim 9 wherein said weak basic developer solution is a sodium carbonate, sodium bicarbonate, sodium metasilicate, or tetramethyl ammonium hydroxide solution.

11. A positive photoresist composition according to claim 10 wherein said weak basic developer solution is a sodium metasilicate solution.

12. A positive photoresist composition according to claim 10 which can be developed in at least two stages with stepwisely increased concentrations of said developer solution.

13. A positive photoresist composition according to claim 1 which comprises about 5 to 20 wt % of said photosensitive compound, about 20 to 50 wt % of said phenolic resin, and about 30 to 75 wt % of an organic solvent.

14. A positive photoresist composition according to claim 13 wherein said organic solvent is ethylene glycol monomethyl ether acetate, ethyl ethylidenelactate, N-methylpyrrolidone, cyclopentanone, or a mixture thereof.

15. A positive photoresist composition according to claim 13 wherein said photosensitive compound is a quinonoediazide-based compound represented by the following formula:

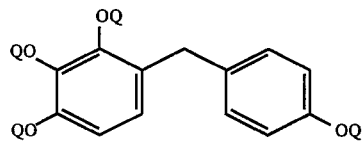

wherein Q is 1,2-naphthoquinone diazide-4-sulfonyl radical or 1,2-naphthoquinone diazide-5-sulfonyl radical represented by the following formulas, respectively:

(a) 1,2-naphthoquinone diazide-4-sulfonyl radical:

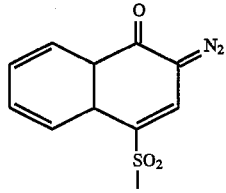

(b) 1,2-naphthoquinone diazide-5-sulfonyl radical:

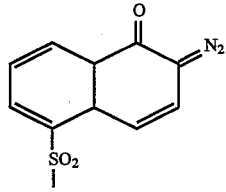

* * * * *